United States Patent [19]

Rogers

[11] Patent Number: 5,337,261
[45] Date of Patent: Aug. 9, 1994

[54] DESIGNING AND EVALUATING FILTERS FOR SUPPRESSING UNDESIRED SIGNALS

[75] Inventor: Wesley A. Rogers, Grosse Pointe Park, Mich.

[73] Assignee: Electronic Development, Inc., Grosse Pointe Park, Mich.

[21] Appl. No.: 862,522

[22] Filed: Apr. 2, 1992

[51] Int. Cl.$^5$ ............................................. H03H 17/00
[52] U.S. Cl. ................................... 364/572; 364/574; 364/480; 324/613; 455/296
[58] Field of Search ............... 364/572, 574, 488, 480; 324/649, 651, 627, 628, 612, 613; 455/296, 300, 307, 347

[56] References Cited

U.S. PATENT DOCUMENTS 4,939,446  7/1990  Rogers ................................ 324/72
4,996,488  2/1991  Nave ................................... 324/613

OTHER PUBLICATIONS

Cendes, Z. J., "EM Simulators=CAE Tools", IEEE Spectrum, Nov. 1990, pp. 73-77, 93.
Makran, E. B., Subramaniam, E. V. Ad Girgis, A. A., "Harmonic Filter Design Using Actual Recorded Data," Conference Paper, 4-92, pp. B2-1-B2-7.
Anderson "S-Parameter Techniques For Faster, More Accurate Network Design", Hewlett Packard Application Note, 95-1, (1967).
Operating Manual For The Model 3577A Network Analyzer and Model 35677A/B S Parameter Test Set, Chapter 3, pp. 3-1 to 3-38, Hewlett Packard (1983).

Primary Examiner—Jack B. Harvey
Assistant Examiner—Jae H. Choi
Attorney, Agent, or Firm—Davis Hoxie Faithfull & Hapgood

[57] ABSTRACT

A method and apparatus for use in designing and evaluating filters to resolve undesired signal transmission in a device including, without limitation, EMI filters for suppressing an identified EMI in a device under test in a particular application. The complex impedance of the source impedance presented to the filter and the load impedance presented to the filter are separately determined over a frequency range of interest. The impedances are used to determine a complex power flow of the device under test without the filter. The power flow is used to identify frequencies corresponding to the undesired signal transmission. A filter is then designed or selected, based upon the complex impedances of the filter load impedance and filter source impedance at the identified resonant frequencies, to attenuate the identified resonances or undesired signal transmission over each frequency range of interest. The attenuation of the proposed filter design is then verified using either the frequency response of the designed filter or the determined power flow of the device with the filter design analytically inserted at the test point. The magnitude of the attenuation or the difference in power flow is evaluated to determine if the filter attenuates the undesired signal transmissions adequately. A computer controlled tool is used to conduct the measurements and comparisons.

143 Claims, 5 Drawing Sheets

POWER: SOURCE:Z3531BEN LOAD:Z3531C_D FILTER:BERNUM4

DESIGNING AND EVALUATING FILTERS FOR SUPPRESSING UNDESIRED SIGNALS

FIELD OF THE INVENTION

This invention relates to designing, characterizing and testing filters for selectively suppressing electrical signals, more particularly, to designing, characterizing and testing the design efficacy of a filter for suppressing electromagnetic radiation interference (EMI) in a particular device.

BACKGROUND OF THE INVENTION

Electromagnetic radiation may couple to leads or cables connecting electrical components within a device or connecting one component or device to another device or to a power source. If the electromagnetic radiation coupling is excessive, the induced energy can interfere adversely with the intended operation of the component, device or associated devices. This electromagnetic susceptibility is referred to as electromagnetic interference ("EMI").

Commercial facilities and well-known procedures exist for testing electronic devices for EMI. Typically, EMI is determined as a result of a test for one or more of radiated emissions, conducted emissions, radiated susceptibility and conducted susceptibility. Such tests are conducted by placing the device under test inside a "screen room", also known as an R-F enclosure or a faraday cage, which completely shields the device under test from external ambient electromagnetic radiation. The device is then exposed to a controlled level of electromagnetic radiation, e.g., between 1 and 300 v/m, that is swept through a selected frequency range, e.g., from 10 Hz to 18 GHz. The device is then monitored or measured for electromagnetic susceptibility over the selected frequency range using probes, preferably probes that are transparent to the electromagnetic radiation, and an oscilloscope, spectrum analyzer or other display device. The test results are then compared to an appropriate predetermined reference standard to determine whether the device under test has a tolerable electromagnetic immunity or EMI susceptibility that requires correction.

EMI is determined to exist when the sweep test results deviate from the correct or desired performance characteristics by a determinable amount. This may occur in one or more frequency ranges of the sweep test. Once the frequency (or bandwidth) and magnitude of the EMI is known, an EMI filter can be designed or a commercially available EMI filter can be selected and used to suppress the EMI signals. If the EMI occurs in discrete frequency ranges, more than one EMI filter may be used. Known filters include both broadband filters, T-filters, and notch filters, for example, Butterworth notch filters, and mechanical type filters (rod, disc, and plate resonators), "ferrite beads", etc.

One of the problems with the known techniques is that the design or selection of an appropriate filter for suppressing EMI in a specific application has largely been a matter of trial and error. It requires an individual of considerable experience in the field to design or select a filter, which filter then must be installed in the device and sweep tested to determine whether the filter has adequately achieved the intended purpose. This results in a time consuming process which can take days, weeks or sometimes months to resolve. For sweep tests using controlled electromagnetic fields, it also requires substantial time in a screen room to test each variation of the EMI filter design. It costs between $1000 to $3000 per day to rent a screen room.

Another problem with the known techniques is that conventional sweep tests of the device under test provide information only for a measured resistance, and do not take into consideration or measure the imaginary portion of the actual complex impedance. Thus, the selection of an EMI filter design for the device under test is complicated by having to guess at the imaginary impedance component corresponding to the determined resistance, and then trying different design variations until a particular filter design works adequately.

Heretofore, there is no known commercial tool or technique for use in designing an EMI filter efficiently or for determining whether an EMI filter design will likely suppress the undesired EMI to about the appropriate specification limits, prior to sweep testing a selected EMI filter prototype installed in the device under test.

There thus remains a continuing need for improvements in designing or selecting an appropriate filter for suppressing EMI susceptibility in electrical devices and determining whether the selected design will achieve the desired suppression of EMI.

SUMMARY OF THE INVENTION

It is, therefore, an object of this invention to provide improvements in designing or selecting a filter for suppressing electrical signals at selected frequencies in an electrical device.

It is a further object of the present invention to provide the same for suppressing identified EMI in a specific device in a given application. It is yet another object to characterize the EMI filter design for use in the electrical device. It is another object to conduct analytically a test of the efficacy of the proposed EMI filter design for the device.

It is another object to provide a computer tool for measuring complex impedances of an electrical device under test at one location and for facilitating the design of a suitable filter at any location. It is yet another object to test the efficacy of the proposed filter design at any location, which may be remote from the device under test. It is another object to reduce the time needed to develop an efficacious filter design. It is another object to provide for evaluating modified filter designs prior to constructing an actual EMI filter.

It is another object of the present invention to reduce the time and expense of developing effective EMI filters for particular devices and applications. It is another object to provide for designing an effective EMI filter prior to sweep testing the device under test with an EMI filter according to the design.

In accordance with the foregoing objects, the present invention provides apparatus, methods and systems for designing, characterizing and evaluating a filter to suppress undesired electrical signal transmission at one or more selected frequencies or frequency ranges in an electrical device. Broadly, the invention concerns various improvements in filter design and implementation including (1) determining the complex impedance of source and load of the device under test, measured relative to the point at which the filter will be inserted in the device, (2) selecting a proposed filter design based on the source and load complex impedances at those frequencies exhibiting undesired signal transmission, and (3) determining whether a proposed filter design will adequately filter the undesired signals based on the source and load complex impedances at frequencies to be suppressed. Preferably all three aspects are sequentially used in a computer tool to design and evaluate an effective filter for the device under test.

Although the invention is described in the context of a preferred embodiment of the invention, namely EMI filters for suppressing undesired EMI susceptibility, it should be understood that the invention also applies to any electrical filter for suppressing undesired electrical signal transmission over any frequency range of concern and is not limited to EMI filters for suppressing EMI.

One aspect of the invention concerns determining separately the complex impedance of the source impedance that will be presented to an EMI filter and the load impedance that will be presented to the EMI filter over a frequency range of interest. The determined impedances are used to determine a complex power flow of the device under test without any EMI filter. The power flow is in turn used to identify one or more frequencies corresponding to the previously identified EMI. Then, the complex impedances at the one or more frequencies can be used to design an EMI filter.

A second aspect of the invention concerns designing a suitable EMI filter. The EMI filter is designed or selected based upon the complex impedances of the filter load impedance and filter source impedance at the identified one or more frequencies. The EMI filter is designed to provide a mismatch between the filter source and filter load to attenuate the conducted signals at each identified frequency or over a bandwidth corresponding to each identified frequency over a selected frequency range.

A third aspect of the invention concerns analytically characterizing and testing a proposed EMI filter design. In this aspect, the design of a proposed EMI filter is evaluated or characterized using either the impedance-frequency response of the proposed EMI filter design or the determined power flow of the device with the proposed EMI filter design analytically inserted at the test point. The latter is obtained based on the complex impedance of the source presented to the filter and the load presented to the filter over a frequency range of interest. The EMI filter parameters are incorporated into the network. The magnitude of the attenuation of the proposed EMI filter design or the difference in power flow of the device with and without the proposed filter is evaluated to determine whether or not the EMI filter design sufficiently attenuates the EMI in the frequency range or ranges of interest.

Another aspect of the invention is directed toward a method of evaluating the efficacy of a filter design in a device under test. One such method includes the steps of:

(a) measuring the source and load impedances of the device over the frequency range of interest, the measurements being taken at the point where the EMI filter is to be inserted;

(b) determining the frequency response of the filter design over the frequency range of interest; and (c) determining the frequency response of the device with the filter design inserted at the point over the frequency range, based on the determined source and load impedance and frequency response of the filter design.

The determination may be made analytically, or it may be made based on a measure of a construct according to the filter design.

Preferably, where the filter is an EMI filter, the method also includes the steps of sweep testing the device for EMI, and sweep testing the device with an EMI filter corresponding to the filter design inserted at the point to confirm that the EMI filter obtains a result comparable to the result of step (c). The sweep test is preferably based on a controlled radiation field applied when the device under test is in a screen room. However, a sweep test also may be based on any applied radiation field as may occur, for example, in the operating environment of the device under test or in an ambient electromagnetic field.

Preferably, measuring the impedance of each of the source and the load is performed over the selected range of frequencies, one frequency at a time, by sending a precision voltage at each one frequency into the source and measuring the reflected voltage and sending a precision voltage into the load and measuring the reflected voltage. From the reflected voltages, the corresponding reflection coefficients and the complex source and load impedance at each one frequency may be determined for the load and the source. The complex impedances may be used to calculate the power flow between the source and the load, normalized to the characteristic output impedance of the impedance measuring device, i.e., a network analyzer. A computer controlled tool is preferably used to conduct the measurements and comparisons although the same could be performed manually.

BRIEF DESCRIPTION OF THE DRAWINGS

Further features of the invention, its nature and various advantages will be apparent from the accompanying drawings and the following detailed description of the invention in which like reference numerals refer to like elements and in which.

DETAILED DESCRIPTION OF THE INVENTION

Figure 1:
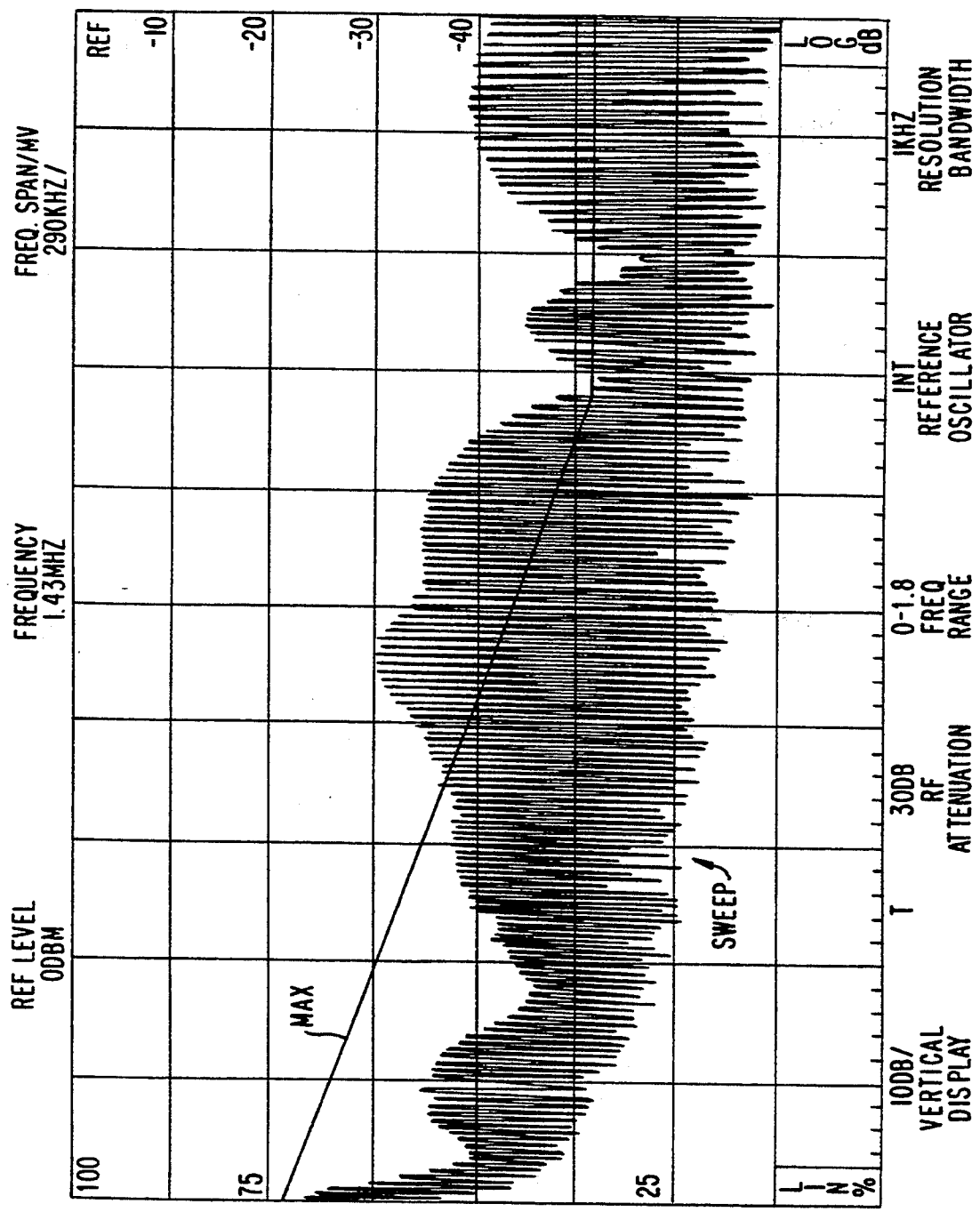
FIG. 1 is a graphical representation of a sweep test of a device under test in units of dBm versus frequency.
Figure 2:
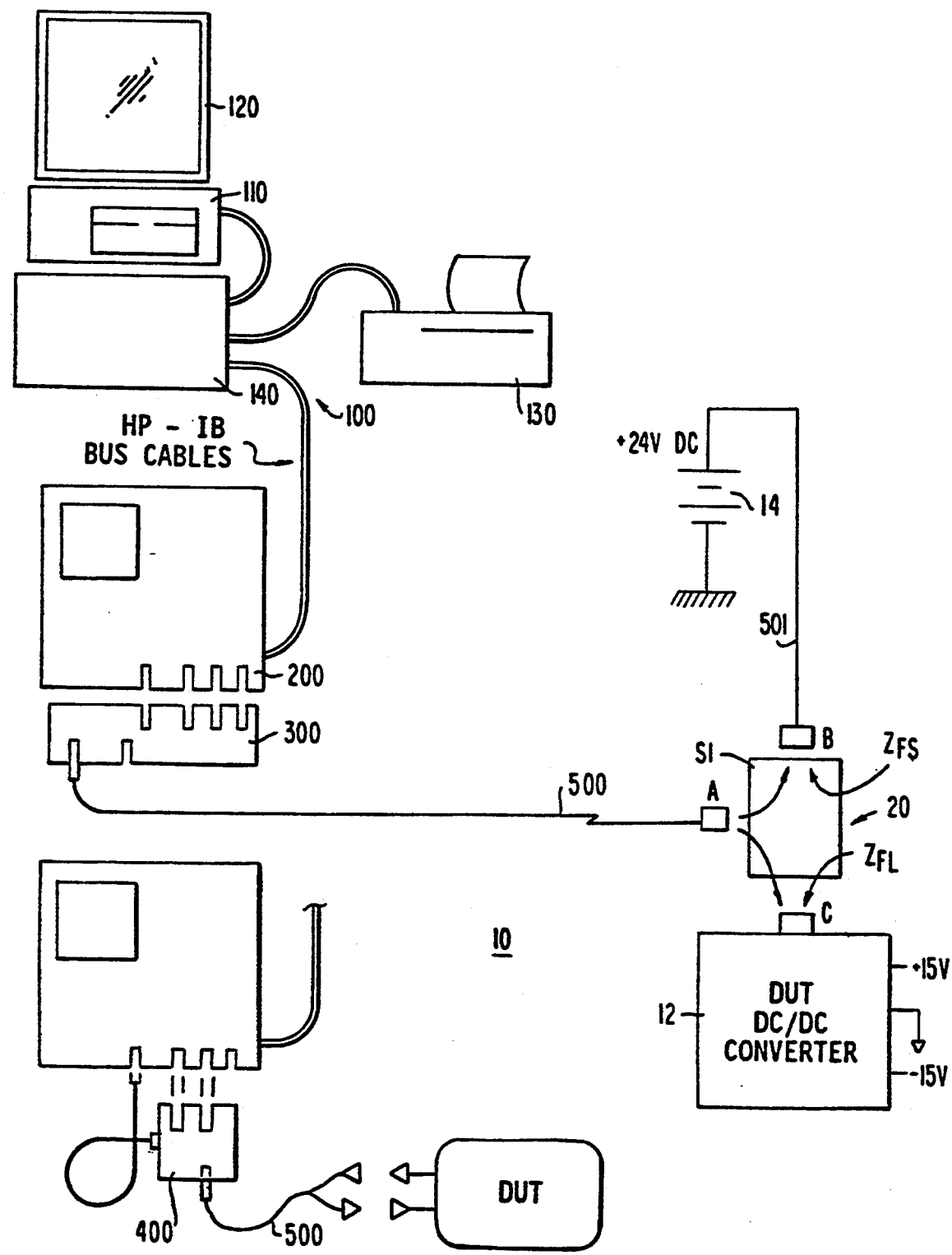
FIG. 2 is a block diagram of the apparatus in accordance with a preferred embodiment of the present invention for developing an EMI filter for the device under test of FIG. 1.

FIG. 1 shows the results of a conventional conducted emissions type sweep test using a controlled field on a device 10 under test, located in a screen room, according to the Mil-STD 461/462 Conducted Emissions (CE) Test Specification. The results are in the standard dbm Spectrum Analyzer units (dBm=dBμV−107 dB). Device 10 is a +24 volt to ±15 volt dc/dc converter 12 that draws 3 amperes from a remote +24 volt battery source 14 (FIG. 2). The spectrum analyzer, model 494AP manufactured by Tektronix, was used to measure the noise voltages versus frequency emitted by the converter 12 onto the +24 V DC power line. The maximum acceptable emission for the test specification Mil-50 461/462 is illustrated by the curve labeled Max on FIG. 1.

Referring to FIG. 1, the conducted emissions (CE) level of device 10 was above the specification limit Max over most of the frequency span between 1 and 3 MHz. The amount over the limit Max was up to 10 dB and occurred at several points in the range between 0.1 and 3 MHz during the radiated field sweep test. Accordingly, based on a comparison of the spectrum emission curve to the specification limit curve Max, it is apparent that an EMI filter having an attenuation of at least 10 dB in a frequency range centered at 1.43 MHz is required to reduce the conducted emission at that frequency range to below the limit specification curve Max. Thus, having identified that EMI exists, it is necessary to identify a point 20 for the insertion of an EMI filter and to select an appropriate EMI filter. This is done in a conventional manner by selecting an appropriate connection point in device 10 under test.

According to the present invention, the next step is to measure separately the filter source impedance, in this case at connector B, and the filter load impedance, in this case at connector C, relative to point 20. Thereafter, a network design approach can be worked out as described below.

FIG. 2 shows a computer tool for use in measuring the filter source and filter load impedances, designing an EMI filter or selecting an EMI filter design, and evaluating the efficacy of the design in accordance with a preferred embodiment of the invention. The apparatus includes a minicomputer 100, a network analyzer 200, an S-Parameter Test Set 300, optionally a Reflectance/Transmittance Test Set 400, and a test lead 500 having a conventional BNC connector as terminal A. Also shown is device 10 under test.

Although device 10 may be any device, FIG. 2 illustrates device 10 as the aforementioned voltage converter 12 connected to battery 14 by a harness cable 501. Cable 501 has a conventional BNC end, terminal B, which is to be connected to input C of converter 12. The negative pole of battery 14 is connected to ground. Point 20, at which an EMI filter (not shown) is to be inserted, is between terminals B and C.

Minicomputer 100 preferably includes a microprocessor, associated memory (not shown), a keyboard (not shown), disk drive 110, a display monitor 120 and a printer 130. Disk drive 110 preferably includes at least one floppy disk drive which is useful for recording data on a disk for subsequent processing, for example, at a different minicomputer. Monitor 120 and printer 130 are provided for presenting data in text, graphic, and tabular form.

Minicomputer 100 and its associated display devices may be any conventional microprocessor based device. A preferred mini-computer 100 includes a Hewlett-Packard Technical Computer Model No. HP217, a keyboard Model No. HP46020A, a video monitor Model No. HP35721A, a dual floppy disk drive Model No. HP9122D, and a printer Model No. Think Jet HP2225A, all commercially available from Hewlett-Packard Corporation, Palo Alto, Calif. Network Analyzer 200 may be any device for determining the real and imaginary impedance components of a network or device applied to analyzer 200 in the frequency range of interest, e.g., from 10 Hz to 18 GHz. One preferred analyzer is model No. HP3577A, available from Hewlett-Packard, which may be operated under microprocessor control using the Hewlett Packard Basic programming language. S-Parameter Test Set 300 may be any device for determining the reflection coefficient in a transmission line, and is preferably a model No. HP35677A, available from Hewlett-Packard. Reflectance/Transmittance Test Kit 400 may be any signal divider device for measurement of low frequencies below 100 KHz, and is preferably a model No. HP35676A, available from Hewlett-Packard. These devices are used in determining the signal reflection coefficient from which the load impedance may be derived in a conventional manner. A suitable data and control bus 150 may be used to interconnect the components of a minicomputer 100 and network analyzer 200, e.g., an HP-IB bus available from Hewlett-Packard Corporation, an IEEE-488 Interface bus, or similar device. Test lead 500 has terminal A for use in measuring the source impedance that will be presented to an EMI filter (the "filter source" impedance) when connected to terminal B, and the load impedance that will be presented to the EMI filter (the "filter load" impedance) when connected to terminal C. Lead 500 is any suitable conductor for transmitting frequencies in the range of interest. For example, for frequencies up to about 200 MHz, lead 500 is preferably a 50 ohm coaxial cable, such as Belden Wire & Cable Model No. 9310 (military designation RG 58/U), having a conventional connector.

Referring to FIG. 2, network analyzer 200 is used together with either S-Parameter Test Set 300 (frequency>100 KHz) or Reflectance-Transmittance Test Set 400 (frequency<100 KHz). Lead 500 is connected to Port 1 of network analyzer 200 when S-Parameter Set 300 is used and to the 50 ohm output of network analyzer 200 when Reflectance-Transmittance device 400 is used. Such connections are known to persons of ordinary skill in the art.

The impedance measurements of the present invention are made at numerous discrete frequencies. The frequency set is selected by the operator and includes frequencies between a minimum and maximum frequency (subject to the capacity of network analyzer 200). Preferably, a sample set of 244 or 400 discrete frequencies, relatively equally distributed within the selected frequency range, is used. Other frequency sample sets could be used. The frequency sample set is preferably selected through software used to control the apparatus for obtaining the impedance measurements.

The term impedance vector refers to the real and imaginary component of the determined load impedance $Z_L$ at a given frequency. The term impedance vector array refers to the array of impedance vectors of the load impedance $Z_L$ for the respective discrete frequencies in the sample set used in the analysis.

The frequency range and the frequency resolution of a sample set may be decreased or increased as deemed appropriate under the circumstances. A plot of the impedance over the desired frequency range can then be presented, and a table printed for all 400 frequencies, or for every tenth frequency. Also, where a resonance is found to occur one can measure the impedance at closer frequency intervals, to provide a detailed plot showing the precise nature and the peak point of the resonance. In as much as most EMI filters have a bandwidth that is wider than the discrete frequency spacing intervals, selecting the precise peak frequency is usually not necessary.

As noted, each impedance measurement is preferably based on measuring the voltage reflected from load being measured in response to a known voltage and current signal that is delivered to the load at a given frequency. The known transmitted and reflected voltages and the known source load impedance are used to determine a reflection coefficient. The reflection coefficient is the ratio of the voltage supplied to a load from input terminals divided by the voltage reflected back to the input terminals. When the source impedance $Z_S$ (i.e., the source impedance of S-Parameter Test Set 300 or Reflection/Transmittal Test Set 400) is the conjugate of the load impedance $Z_L$ (i.e., one of the filter source impedance $Z_{FS}$ and filter load impedance $Z_{FL}$ of the device under test), meaning that the resistive or "real" component of $Z_S$ and $Z_L$ are equal and their reactive or "imaginary" components are equal and opposite, all of the power will be absorbed by the load, and the reflection coefficient will be zero.

By knowing both the source impedance $Z_S$ and the input voltage, and measuring the reflected voltage, to obtain the reflection coefficient, $Z_L$ can be computed. These relationships are employed to determine the impedance of each of the filter load $Z_{FL}$ and filter source $Z_{FS}$ at each of the discrete frequencies in the selected frequency set.

The filter source impedance and filter load impedance are separately obtained from the normalized network analyzer reflection coefficient as follows:

$$Z_n = (1+\rho)/(1-\rho)$$

where $\rho$ is the measured reflection coefficient and $Z_n$ is the impedance of the load normalized to $50+j0$ ohms; and $$Z = 50\, Z_n$$

where Z is the non normalized impedance measurement. A detailed description of impedance measurements and reflection coefficients is provided by the Hewlett Packard Product note 3577A - 1, titled "User's Guide to the HP 3577A Network Analyzer."

It is preferred to select a known source impedance $Z_s$. Also, it is preferable to select a source impedance $Z_s$ that is purely resistive, such as 50 ohms. The apparatus can be calibrated for the complex impedance contributed by interconnecting lead 500, a switch S1, and any associated connectors. The resistive and reactive components of these elements in their various configurations, at each frequency to be measured, can be recorded and stored. Switch S1 is provided to switch automatically terminal A of lead 500 between terminals B and C under control of minicomputer 100. The stored calibration data can be subtracted from the determined impedance measurements in a conventional manner to yield the impedance characteristics of the filter source and filter load impedances, independent of the contribution of the test apparatus.

In operation, the selected frequency set determines whether to use S-Parameter Test Set 300, Reflectance-Transmittance Test Set 400, or both. The appropriate device is then conventionally connected to network analyzer 200. Network analyzer 200 is then calibrated over the selected frequency sample set, using lead 500, switch S1, and their associated connectors, connected to the appropriate terminal of network analyzer 200 (Port 1 or the 50 ohm output). The calibration procedure is performed at each discrete frequency in the provided sample set, and is conventional, e.g., measuring the test equipment with an open circuit, a closed circuit, and a matched load impedance. The determined calibration impedance vector array is stored in memory so that it can be removed from measured impedance vector array of the filter source and filter load. Thus, $Z_s$ is known for the frequency sample set. It is to be understood, however, that apparatus 100 need not be calibrated for each operation, if a prior calibration of the test apparatus in the same configuration has been made.

To perform the impedance measurements, lead 500 is connected to the impedance $Z_L = Z_{FS}$ or $Z_{FL}$ to be measured by switch S1. Network analyzer 200 is then operated, preferably under software control, to select one frequency in the frequency sample set, to transmit a predetermined signal, typically 0 dbm (0.224 Vrms into 50 ohms), at that frequency, down the transmission line formed by lead 500 terminal A being connected to either terminal B or C, and to calculate the impedance vector at its output as a function of the signal reflected back to network analyzer 200. Network analyzer 200 is then adjusted, e.g., by a program step, to select another frequency in the sample set, generate the predetermined signal, and calculate the impedance vector based on the reflection coefficient for that frequency. This process continues over the selected frequency sample set, such that the selected frequency set is swept, by the frequency being sequentially indexed in predetermined steps, through the plurality of discrete frequencies, and an impedance vector array is acquired. The acquired impedance vector array is preferably stored on a floppy disk or other medium for subsequent processing, e.g., remote from device 10.

Following acquisition of the measured impedance vector array for the frequency sample set of one of the filter source and filter load, lead 500 terminal A is then connected, preferably by actuation of switch S1, to the other of the filter source and filter load, and a second impedance vector array for the same frequency sample set is similarly obtained.

Switch S1 is preferably operated by software commands. Optionally, switch S1 could include a calibration box having software controlled switches for open circuiting, short circuiting, and applying a load $Z_L$ across the connectors of lead 500 or switch S1. This would provide for automating both the lead 500 connection and test equipment calibration. Of course, switch S1 could be omitted and lead 500 could be manually calibrated, and then connected to terminals B and C, one at a time.

In accordance with one embodiment of the invention, a software program, using an interactive video display and keyboard, may be used to prompt the operator to open circuit and short circuit lead 500 (with or without a switch S1 as the case may be) and apply a matched load across lead 500 for performing the calibration measurements, and subsequently to connect lead 500 to the load impedances $Z_{FL}$ and $Z_{FS}$, one at a time. The operator confirms that the prompt has been executed on the keyboard.

Minicomputer 100, under software control, processes the acquired impedance vector data for the filter source and filter load impedance vector arrays. The impedance contributed by the test leads and equipment are removed when appropriate. Using the equations set forth below, the power flow between filter source and filter load impedance of the device under test is calculated at each frequency in the sample set, i.e., between the remote battery 14 source impedance at connector B and the input impedance of DC/DC converter 12 at terminal C. The power flow curve (see FIG. 5) is in watts versus frequency. The power flow calculation is accomplished by the following equations.

$$R_E(P) = \left|\frac{V_O}{Z_O}\right|^2 R_O e^{-2\alpha s}\left(1 - |\rho_L|^2 - \frac{2X_O}{R_O} I_M(\rho_L)\right)$$

$$I_M(P) = \left|\frac{V_O}{Z_O}\right|^2 X_O e^{-2\alpha s}\left(1 - |\rho_L|^2 + \frac{2R_O}{X_O} I_M(\rho_L)\right)$$

where:

$Z_O$, $R_O$, $X_O$ are the filter source impedance terms $Z_{FS}$, $R_{FS}$, $X_{FS}$ respectively;

$$\rho_L = \frac{Z_{FL} - 50\Omega}{Z_{FL} + 50\Omega} = \text{filter load reflection coefficient;}$$

$e^{-2\alpha s} = 1$ for a zero length transmission line;

$$v_O = \text{incident voltage wave} = \frac{V_S}{1 + \rho_S};$$

$$\rho_S = \frac{Z_{FS} - 50\Omega}{Z_{FS} + 50\Omega} = \text{filter source reflection coefficient;}$$

$V_S = 1 + j0$; and $R_e(P)$, $I_m(P)$ are the real and imaginary power flow terms.

The determined impedance vectors and power flow may be printed out by minicomputer 100 in text, graphic, and tabular form, and may be stored on floppy disk for further evaluation. When printing tabular data, if a large frequency sample set is employed, it is more convenient to select a subset of the accumulated database, for example, every tenth point, so that for a four hundred sample set, only forty points of data will be printed. Thus, the full graphical and partial tabular data are believed to be sufficient to ascertain the nature of the filter source impedance, filter load impedance, power flow, or any combination of the foregoing, for the device being evaluated. It is of course possible to increase the both frequency resolution of the sample set acquired and displayed and the frequency range within the needs under the circumstances and within the capability of the computer. However, the four hundred sample set is believed to be an adequate compromise between complexity and thoroughness, and the need to make a useful and practical device.

Where, for example, a resonance is found to occur at a test sample frequency, it may be desirable to increase sampling rates in the area of the resonance so that the peak resonant frequency can be more precisely determined, and the nature of the resonance considered in detail.

Figure 3:
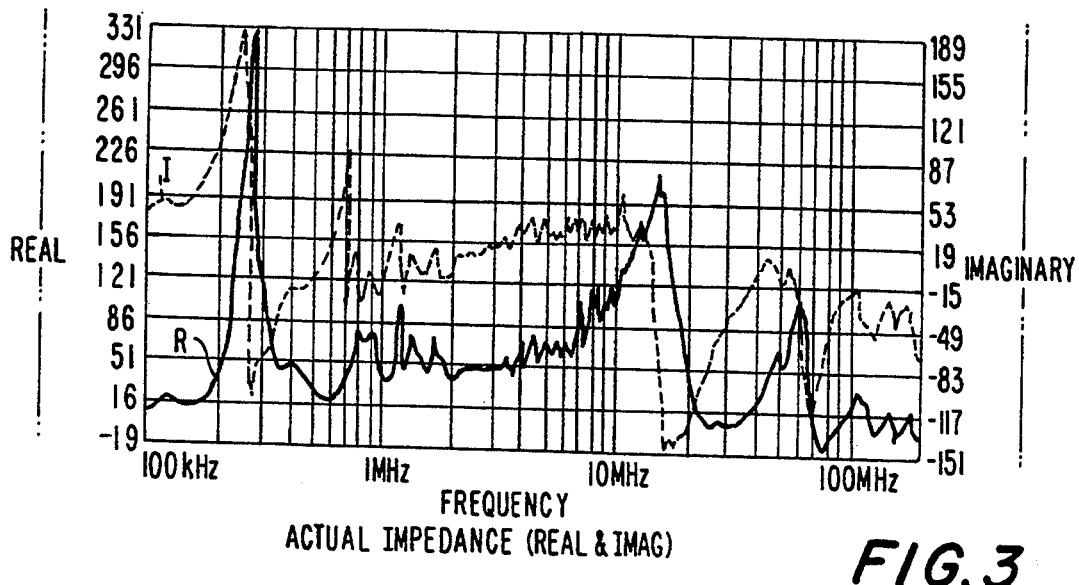
FIGS. 3 and 4 graphical representations of the measured filter source and filter load impedances, respectively, of the device under test of FIG. 1.

Referring to FIGS. 1 and 3, the calibrated impedance vector array measured for the filter source impedance $Z_{FS}$ of the embodiment of FIG. 1, i.e., looking at battery 14, are illustrated. FIG. 3 illustrates the impedance vector array acquired with lead 500 connected to terminal B using the method described above as real (left ordinate) and imaginary (right ordinate) components, in curves R and I, respectively, in ohms of the actual impedance, versus frequency (abscissa). The high impedance resonances in FIG. 3 are believed due primarily to harness 501 resonance rather than battery 14 impedance rise. The increasing real impedance is believed due primarily to battery 14 internal impedance changes as higher radiated field frequencies couple onto the harness lead 501 between connector B and battery 14.

Figure 4:
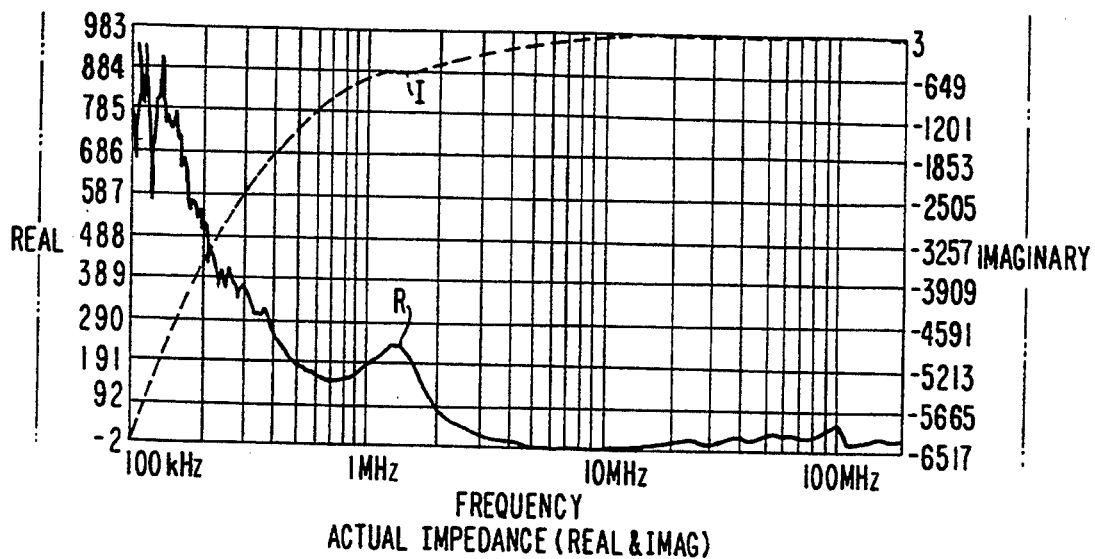

FIG. 4 illustrates the impedance vector array data taken using the same measuring technique for the filter load impedance, $Z_L = Z_{FL}$, measured with lead 500 connected to test terminal C. FIG. 4 shows a graphical plot of the real and complex impedance curves R and I, respectively, verses frequency.

Figure 5:
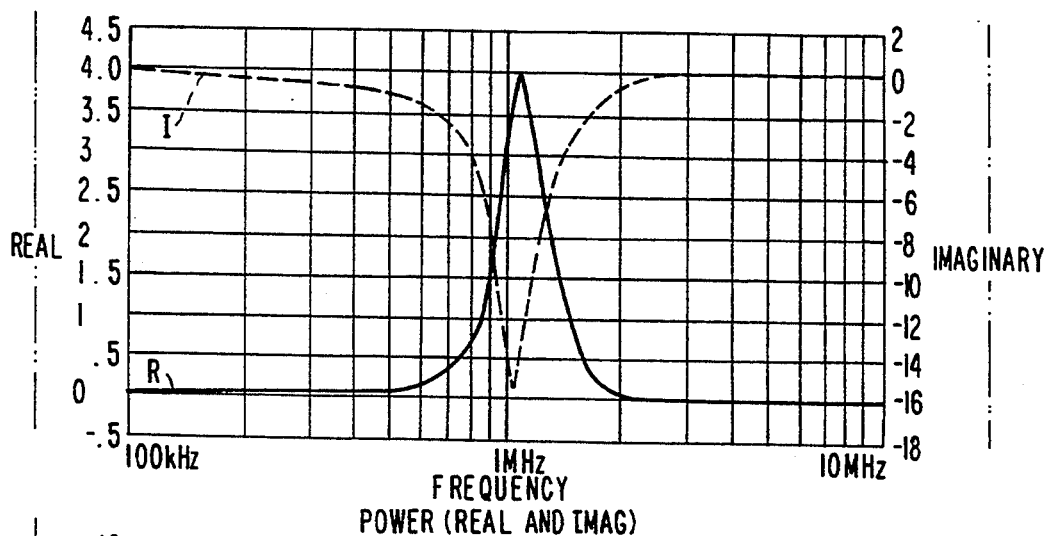
FIG. 5 is a graphical representation of the power flow between the filter source and filter load impedances of the device of FIG. 1.

FIG. 5 shows the real and imaginary power flow, curves $R_p$ and $I_p$ respectively, in units of watts, for the device 10. The power flow is calculated from the determined filter source and filter load impedances vectors relative to the test point at each frequency in the selected frequency sample set, i.e., between 100 KHz and 200 MHz. It is noted that the impedance and power curves also can be plotted in terms of the magnitude (dB) and phase angle. The magnitude and phase angle plot is simply an equivalent and alternative way of portraying the impedance or power in real and imaginary terms.

Antenna effects, wherein the transmission line load can radiate or couple to an external electromagnetic field, are related to the resonances. A harness lead 501 will couple with a radiated field at frequencies where it acts like an efficient transmission line. That occurs where the filter source and load impedances are complex conjugates. Note in FIG. 5 the 4 watt peak in power transfer at 1.43 MHz, which is where the highest electromagnetic susceptibility of the device under test occurred (see FIG. 1).

Referring to FIG. 5, the real component of the power flow rises significantly, and the imaginary component drops significantly, at frequencies approaching 1.0 MHz, indicating that the wiring harness is acting as an efficient transmission line.

According to a second aspect of the invention, once the complex impedance measurements are obtained, whether by the foregoing technique or by another technique, the next step is to design a candidate EMI filter, or select from among commercially available designs, based upon the complex impedances, i.e., the real and imaginary components, and the determined power flow based on the complex impedances. The manner in which this is done is indicated in the following example.

EXAMPLE

The EMI filter design is initiated by determining from FIG. 5 the frequency at which the maximum real power flow occurred, in this case 1.43 MHz. From FIGS. 3 and 4, respectively, the real and imaginary components of the filter source impedance $Z_{FS}$ and the filter load impedance $Z_{FL}$ at the identified frequency, 1.43 MHz are obtained. Those determined impedance vectors are:

$Z_{FS} = 68 - j6$ ohms $Z_{FL} = 229 - j\,660$ ohms

Alternately, where tables of the graphical data providing the real and imaginary components are produced, the tables may be used to provide the impedance values. In this regard, tables are preferred for ease of selecting the real and imaginary impedance for filter design.

Figure 6:
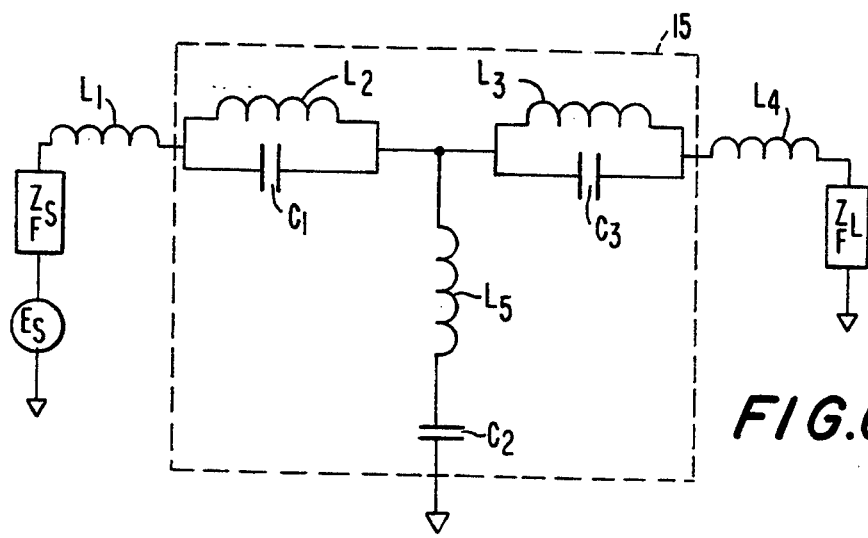
FIG. 6 is a circuit schematic of an EMI filter inserted in a model circuit of the device under test of FIG. 1.

The above source and load impedance terms are then used to determine the following component values for the candidate EMI filter 15, which is shown in FIG. 6:

$L_1 = 0.5\ \mu h$, $L_2 = 100 \mu h$, $L_3 = 30 \mu h$, $L_4 = 75 \mu h$, $L_5 = 8 \mu h$, $C_1 = 90 pf$, $C_2 = 0.02 \mu f$ and $C_3 = 320\ pf$ FIG. 6 shows EMI filter 15 located between inductors $L_1$ and $L_4$, which are respectively located between the filter source impedance $Z_{FS}$ and filter load impedance $Z_{FL}$. EMI filter 15 is illustrated as a Butterworth notch filter designed to provide maximum attenuation at 1.43 MHz between remote battery 14 and the input to dc/dc converter 12. The Butterworth filter was chosen due to its maximally-flat characteristic. The Butterworth function is synthesized from the Butterworth low-pass Transfer Function ($T = 1/(1+W^{2n})$). The standard procedure is to determine the poles of the driving point impedance (1-T). The driving point impedance is then expressed in terms of the poles. Synthetic division of this expression produces a continuous fraction expansion whose values are standard, normalized component values for a given value of n (i.e., the number of elements). These component values may be scaled to the cutoff frequency and impedance level of interest. The high pass filter is derived from the low-pass characteristics by changing capacitors to inductors and vice-versa and then using the reciprocals of the component values. The band reject filter combines both types.

EMI filter 15 shown in FIG. 6 is interposed between inductors $L_1$ and $L_4$, which function to resonate out the capacitive reactance in the measured source impedance $Z_{FS}$ and load impedance $Z_{FL}$ at the notch frequency. Off-the-shelf notch filters that do not compensate for the reactive part of the impedances could easily lose the entire notch.

The filter design is then breadboarded and tested using, for example, the same software to control network analyzer 200 and S-Parameter Test Set 300 that was used to acquire the filter load and filter source impedance vectors. The $S_{11}$, $S_{22}$, $S_{12}$, and $S_{21}$ filter S-parameters, normalized to 50 ohms by network analyzer 200, are then measured and stored on the analysis and memory disk. In this embodiment, the filter frequency attenuation in the forward direction into a 50Ω source and load is $S_{21}$. The reverse attenuation is $S_{12}$. $S_{11}$ and $S_{22}$ are the forward and reverse reflection coefficients. The measured filter S-parameters are then analytically combined with the measured source and filter load impedance vector arrays (FIGS. 3 and 4) preferably using software programs to process the data over the 400 frequency points between 100 KHz and 200 MHz in the selected frequency sample set.

The attenuation of the filter between the actual source and load impedances is determined by first calculating the "Filter Transfer Gain" (G) at each frequency:

$$G = \frac{\text{Power Delivered to Load}}{\text{Power Delivered to Filter}}$$

$$= \frac{|S_{21}|^2 (1 - \rho_L)}{(1 - |S_{11}|^2) + |\rho_L|^2(|S_{22}|^2 - |D|^2) - 2R_e(\rho_L N)}$$

where $D = S_{11}S_{22} - S_{12}S_{21}$ $N = S_{22} - D\,S_{11}^*$

Then, $P_{LOAD}$ (with filter) $= G\ P_{FILTER}$ where $P_{FILTER}$ is determined as $P_{LOAD}$ previously without the filter but now regarding the filter as the load $P_{LOAD} = G\ P_{FILTER}$ and the Insertion Loss (I.L.) provided by the filter between the actual source and load impedance is:

I.L. (dB) $= 10 \log [G\ P_{FILTER}/P_{LOAD\ W/O\ FILTER}]$.

In this Example, which is why this example was selected, the filter maximum band reject point in dB (at phase about 0°) corresponded to 1.43 MHz, where it was designed to be. In most other cases, slight adjustments of the parameters of filter 15 may be needed to accomplish this. When adjustments are required, the EMI filter design may be recalculated, and the frequency response into the source and load imp4dance seen by the filter of the new design determined by test of the modified filter connected between the network analyzer source and receiver (S&R) input ports. For a breadboard design test, the $S_{21}$ frequency response curve can be continually viewed on monitor 120 screen while filter 15 parameters are adjusted. This is an advantage not easily realized without the aid of minicomputer 100.

Figure 7:
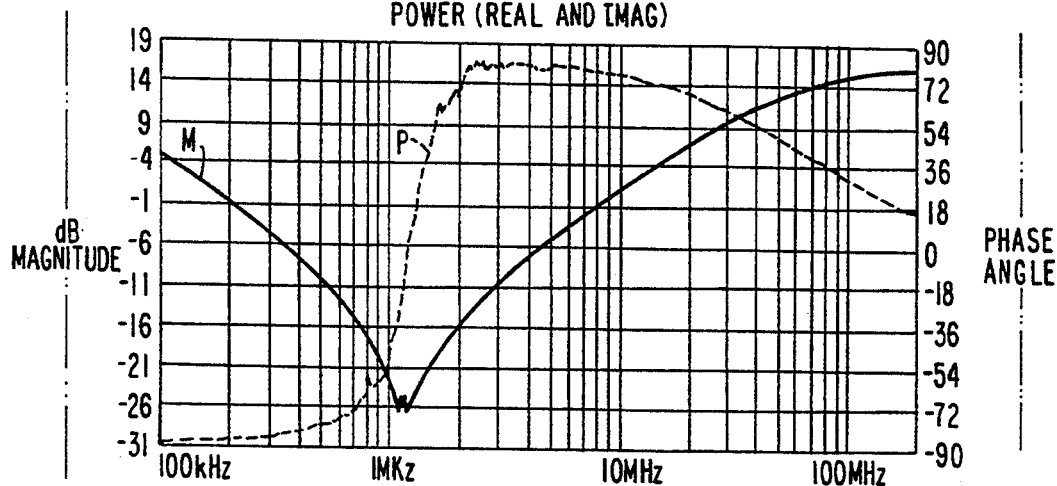
FIG. 7 is a graphical representation of the impedance frequency response of the EMI filter of FIG. 6.

The impedance frequency response curve M in FIG. 7 indicates that the EMI filter design will provide 26 dB of attenuation at 1.43 MHz when inserted between the harness 501 remote battery 14 and dc/dc converter 12 input terminal. This is sufficient to lower the conducted emission radiation level of device 10 below the limit line Max over the frequency range in FIG. 1.

Figure 8:
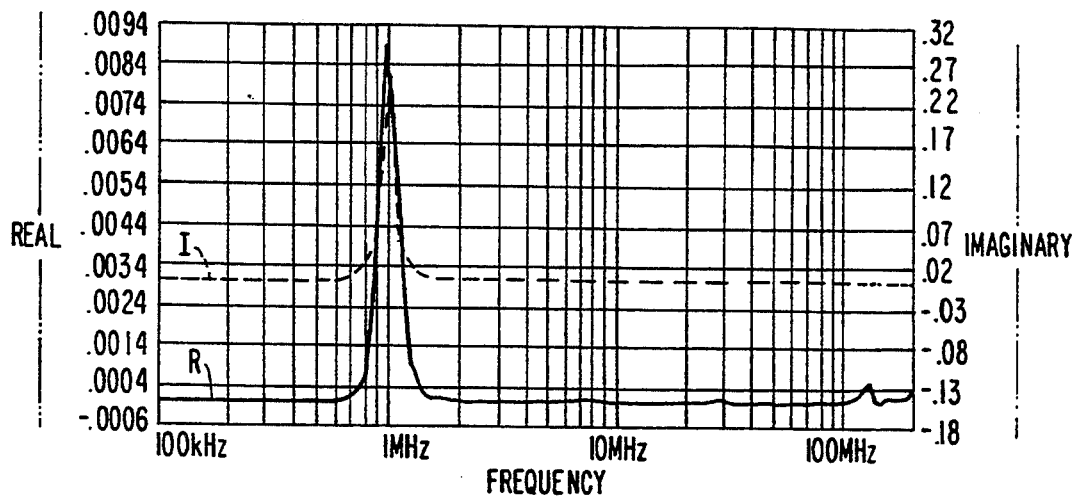
FIG. 8 is a graphical representation of the power flow between the filter source and filter load impedances and the EMI filter of FIG. 6 of the circuit of FIG. 7.

The EMI filter design was further evaluated by calculating the new power flow response curve that would occur when EMI filter 15 is inserted at test point 20 of device 10 under test. The new power flow curve is illustrated in FIG. 8, which shows the real and imaginary power flow curves $R_p$ (left ordinate) and $I_p$ (right ordinate) respectively, in watts, versus frequency (abscissa). Then, by comparing the power flow curves with EMI filter 15 (FIG. 8) and without EMI filter 15 (FIG. 5), it is seen that there is a calculated power reduction at 1.43 MHz from 4 watts without the EMI filter to 0.009 watts with the EMI filter inserted. The reduction in power at 1.43 MHz is given by, P = 10 Log [(Power Flow With Filter)/(Power Flow Without Filter)]

P = 10 LOG [0.009/4] = −26 dB

The EMI filter design achieved the reduction by mismatching source and load impedance at the frequency range centered at 1.43 MHz, and thus reducing the ability of harness lead 501 to transmit EMI that might couple onto the line between 100 KHz and 200 MHz.

Figure 9:
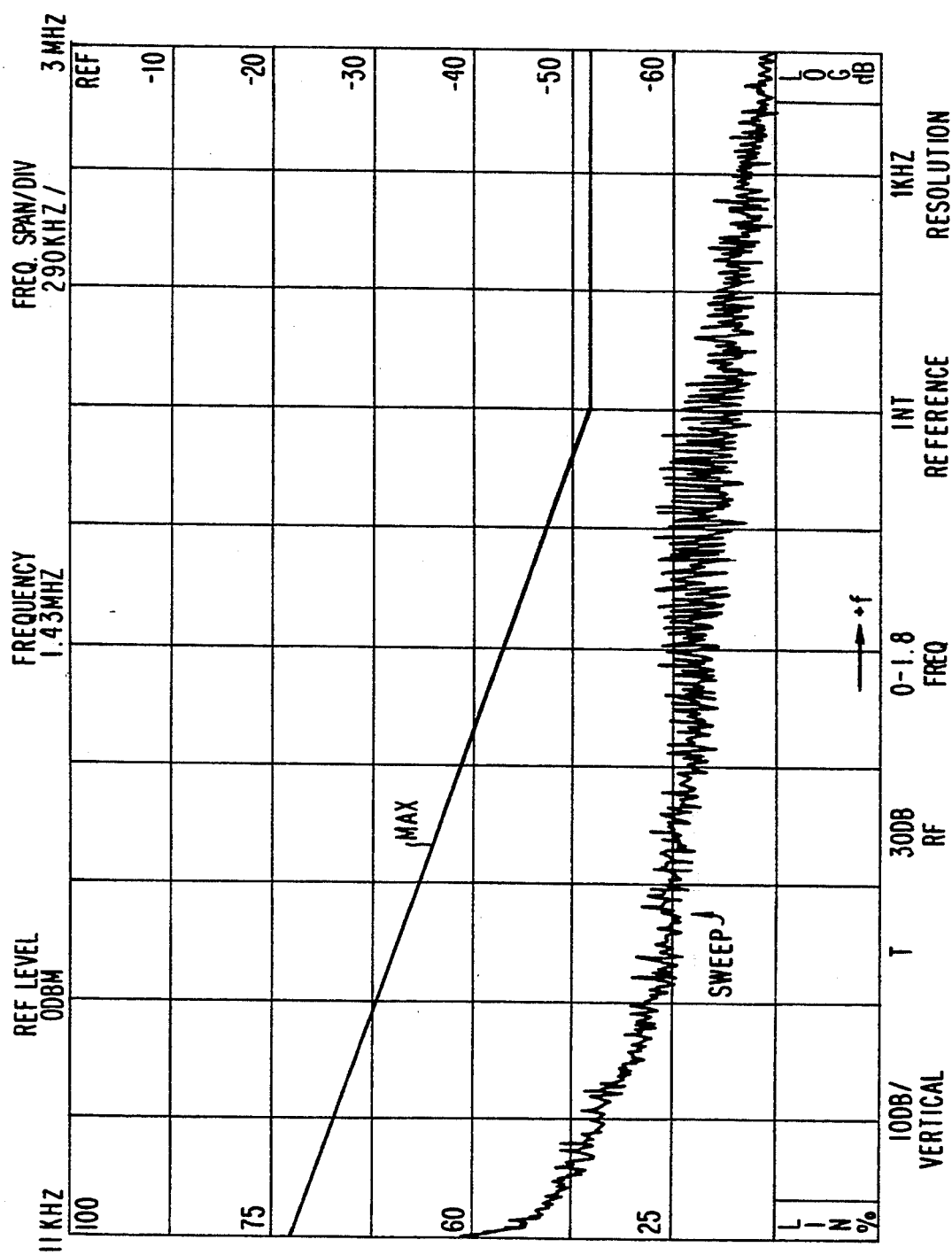
FIG. 9 is a graphical representation of a sweep test of the device of FIG. 2 with the filter of FIG. 6 in units of dBm versus frequency.

A prototype filter according to EMI filter design 15 was constructed as shown in FIG. 6. It was inserted in series with input terminal C of the DC/DC converter 12 and harness 501 terminal B of battery 14, as illustrated in FIGS. 2 and 6, and sweep tested again. The same sequence of steps used to sweep test the device for undesired EMI described in connection with FIG. 1 were used. The results of the frequency sweep are illustrated in FIG. 9. Filter 15 designed according to the present invention successfully reduced electromagnetic susceptibility of device 10 below the limit line Max, as indicated in FIG. 9, thus rendering device 10 electromagnetically compatible and EMI free over the identified frequency range.

Advantageously, the present invention may be used to measure the impedance of any type or portion of an integrated circuit, discrete component or power device, including motors, to design filters, and for evaluating filter designs for correcting various undesired signal transmission problems, including without limitation EMI filters for electromagnetic susceptibility and emissions.

Importantly, it is not necessary to power up the system or device under test in order to make the filter source and filter load impedance measurements, $Z_{FS}$ and $Z_{fl}$, according to the present invention. Consequently, impedance measurements of transportable circuitry and components can be made at a remote facility. Impedance measurements of non-transportable equipment is made at the location where the equipment is located. However, the present invention provides that, for EMI filters, once the initial sweep test for EMI emission is conducted, and once the filter source and filter load impedances are obtained, the subsequent design and analysis of the proposed EMI filter, and analytic verification of the efficacy of the EMI filter, based on the design frequency response, the comparison of the power flows of the device without a filter and the device with the filter, or both, can be performed remote from where the equipment is located and without need of a screen room. This provides for significantly reduced expenses in that first, the actual real and complex impedance are known, thereby reducing the trial and error of installing various filters to determine how well they work, second, adjustments in filter design may be made quickly and verified, and third, filter design occurs at a location convenient to the filter designer, rather than where the equipment is located. It also reduces substantially the time used in and the expense of renting a commercial screen room as compared to prior art filter design and trial and error techniques, with a commensurate savings.

Advantageously, the appearance of multiple resonances in the determined power flow can be resolved by using multiple filters having appropriate bandwidths. These filters can be assembled in series and analytically evaluated individually and/or cumulatively for efficacy prior to actually constructing and installing the complete filter and conducting the sweep test again.

It is noted that the present invention is applicable to any type of electrical filter having an attenuation frequency range for suppressing undesired signal transmissions occurring within that frequency range in a circuit, system or device, and in particular, in any such circuit, system or device in an application where the filter source impedance and filter load impedance are different, e.g., from 50 ohms. Suitable filters include, without limitation, notch filters or T-filters for suppressing signals in a frequency range about a centerpoint of the notch, e.g., Butterworth notch filters, broad and narrow passband filters having a flat or gradual frequency response within the range for suppressing frequencies out of the passband, and low and high pass filters for suppressing frequencies above or below the "corner" frequency of the filter.

The following general procedure applies when designing EMI filters in accordance with an embodiment of the present invention, to render a device under test electromagnetically compatible.

First, a commercial test facility performs a sweep test, e.g., one or more of radiated emissions, conducted emissions, radiated susceptibility or conducted susceptibility. This test reveals electromagnetic susceptibility of or radiation by the device under test above a specified limit curve in one or more frequency ranges. See, for example, FIG. 1.

Preferably, diagnostics could be performed in the RF enclosure using one or more nonmetallic probes to narrow an identified susceptibility problem to a conductively radiating/coupling component of the device under test. The manner in which this is done is described in U.S. Pat. No. 4,939,466 and copending and commonly assigned U.S. patent application Ser. No. 692,719, filed Apr. 29, 1991 and may be conducted using the commercial products referred to as ETVL (EMI Transparent Voltage Monitor Link System) and METVL (Multichannel EMI Transparent Voltage Monitor Link System), which are available from Electronic Development Inc., Grosse Pointe Park, Mich., the assignee of this invention.

Third, filter source and filter load impedances of the system or device under test, relative to a selected location where the EMI filter will be inserted, are measured. These measurements are made at or remote from the client's facility and are inserted into the program memory and analysis disk of minicomputer 100.

Fourth, minicomputer 100 is then used, independently of the device under test, to determine power flow. From the power flow, an EMI filter is designed or selected and stored in the program memory. Minicomputer 100 then tests the selected EMI filter design rapidly for impedance frequency response, power flow differences or both, as described above, and adjusts the EMI filter parameters as instructed by an operator to resolve the EMI problem.

Fifth, the original sweep tests of the first step are repeated with a prototype EMI filter that is constructed according to the selected design parameter and inserted at the selected location in the system or device under test to verify the efficacy of the filter design.

Thereafter, the prototype EMI filter can be converted to a production design for use in production devices, preferably also satisfying any seismic, military or other application packaging requirements.

Another advantage of the present invention is that it is possible to focus on the insertion loss of the EMI filter design at the bandwidth of interest. Thus, if the insertion loss is too small or too great, the filter design may be easily adjusted before incurring the expense of constructing and sweep testing the EMI filter with the device under test. This provides for a more efficient resolution of EMI problems than is available with prior art filter design or selection of off-the-shelf filters.

Suitable software for controlling a network analyzer for measuring impedance of a load over a plurality of frequencies in a given range is commercially available from Hewlett Packard. It is believed that the preparation of suitable software for controlling the above described and equivalent apparatus, to obtain a tool for measuring the calibrated impedance vector arrays and to process such arrays to derive power flow curves, to determine the impedance frequency response of a proposed EMI filter design, and to compare derived power flow curves are well within the ability of a person of ordinary skill in the art.

One skilled in the art will appreciate that the present invention can be practiced by other than the described embodiments which are presented for purposes of illustration and not of limitation.

I claim:

1. A method for use in designing an EMI filter for a device under test having EMI in a first frequency range comprising:
   (a) identifying a test point in the device for inserting an EMI device, the test point having a filter source having a real and imaginary impedance and a filter load having a real and imaginary impedance, the filter source and filter load capable of receiving therebetween an EMI filter;
   (b) determining the real and imaginary impedance of the filter source at each of a first plurality of frequencies spanning, at least the first frequency range; and
   (c) determining the real and imaginary impedance of the filter load at each of the first plurality of frequencies and characterizing the EMI based on the determined real and imaginary impedances of the filter load and filter source to be used in a filter designing process.

2. The method of claim 1 further comprising:
   (d) determining a first power flow of the device under test based on the determined filter source impedances and filter load impedances for the first plurality of frequencies.

3. The method of claim 2 further comprising:
   (e) identifying a frequency in the first power flow corresponding to EMI in the first frequency range; and
   (f) selecting an EMI filter design based on the determined filter source and filter load impedances at the identified frequency.

4. The method of claim 3 wherein the identified frequency corresponds to a resonant condition in the device.

5. The method of claim 3 wherein the selected EMI filter design has a frequency response and an attenuation for a given frequency, further comprising:
   (g) determining the frequency response of the selected EMI filter design in the device for at least the first frequency range; and
   (h) determining whether the selected EMI filter design resolves the EMI in the first frequency range.

6. The method of claim 5 wherein step (h) is based on determining the attenuation provided by the selected EMI filter design over the first frequency range.

7. The method of claim 3 wherein a selected EMI filter design has a frequency response for a given frequency, further comprising (g) measuring the frequency response of an EMI filter according to the selected EMI filter design; and
   (h) determining whether the selected EMI filter design resolves the EMI in the first frequency range.

8. The method of claim 3 further comprising selecting one EMI filter design for each identified frequency in the first detected power flow corresponding to EMI in a distinct frequency range and repeating step (f) for each one EMI filter design.

9. The method of claim 8 wherein each EMI filter is a filter having an attenuation frequency range including an identified frequency in the first determined power flow.

10. The method of claim 3 wherein the EMI filter is a filter having an attenuation frequency range including the identified frequency in the first determined power flow.

11. The method of claim 3 wherein the EMI filter is a Butterworth notch frequency filter having a centerpoint corresponding to an identified frequency in the first determined power flow.

12. The method of claim 3 further comprising:
   (g) determining a second complex power flow of the device under test with the selected EMI filter design inserted at the test point, based on the determined filter source impedance and filter load impedance for the first plurality of frequencies and the selected EMI filter design; and
   (h) determining whether the selected EMI filter design reduces the EMI in the first frequency range based on the first and second complex power flows.

13. The method of claim 12 wherein step (h) is based on determining a difference between the first and second complex power flows over the first frequency range.

14. The method of claim 12 wherein the selected EMI filter design has a frequency response for a given frequency, further comprising determining the frequency response of the selected EMI filter design in the device for at least the first frequency range, wherein determining the second power flow also is based on the determined frequency response.

15. The method of claims 5, 7 or 12 further comprising:
   adjusting the EMI filter design in response to step (h) determining that EMI is not adequately resolved.

16. The method of claims 3, 5, 7, 8, 9 or 11 further comprising:
   constructing an EMI filter according to the selected EMI filter design determined to resolve the EMI in the first frequency range; and
   testing the device with the constructed EMI filter inserted at the test point to verify whether or not the selected EMI filter design resolves the EMI.

17. The method of claim 1 wherein each of the steps of determining the filter source impedance and determining the filter load impedance further comprises measuring a reflected signal in response to a known signal at a selected frequency, determining a reflection coefficient, and converting the reflection coefficient to the real and imaginary impedances.

18. The method of claim 1 wherein each of the steps of determining the filter source impedance and determining the filter load impedance further comprises:
   (i) selecting one frequency in the first plurality of frequencies;
   (ii) transmitting a first signal at the one frequency to the impedance being determined and measuring a second signal reflected from the impedance being determined;

(iii) determining the reflection coefficient at the one frequency;

(iv) determining the real and imaginary impedance at the one frequency based on the determined reflection coefficient; and (v) repeating steps, (i), (ii), (iii), and (iv) for each of a second plurality of frequencies within the first plurality of frequencies.

19. Apparatus for characterizing the impedance at a selected location in a device having EMI in a first frequency range, the location being between a filter source and a filter load comprising:
   a test lead for connecting the apparatus to one of the filter source and the filter load at the selected location;
   a first circuit having an output for providing a signal on the test lead, the signal having a frequency selected from among a selected range of frequencies, the selected range of frequencies including the first frequency range;
   a second circuit for controlling the first circuit to provide an output signal at each of a first plurality of frequencies in the selected frequency range, one frequency at a time;
   means for determining an impedance vector across the output of the first circuit in response to each provided output signal; and
   means for controlling the first and second circuits to obtain a first impedance vector array for the filter load and a second impedance vector array for the filter source.

20. The apparatus of claim 19 further comprising means for determining a first power flow of the device based on the first and second impedance vector arrays.

21. The apparatus of claim 20 wherein the EMI filter design has a frequency response for a given frequency, further comprising means for receiving an EMI filter design and means for determining the frequency response of an EMI filter design based on the first and second impedance vector arrays.

22. The apparatus of claim 21 further comprising means for determining whether the EMI filter design sufficiently reduces the EMI in the first frequency range based on the frequency response of the EMI filter design.

23. The apparatus of claim 21 further comprising a display device for displaying the first determined power flow for identifying a frequency corresponding to EMI in the first frequency range and for displaying the frequency response of the EMI filter design for determining whether the EMI filter design will resolve the EMI.

24. The apparatus of claim 20 further comprising means for receiving an EMI filter design and means for determining a second power flow of the device with the EMI filter design inserted at the selected location.

25. The apparatus of claim 24 further comprising means for determining whether the EMI filter design sufficiently reduces the EMI in the first frequency range based on the first and second power flows.

26. The apparatus of claim 20 further comprising means for indicating a frequency in the first determined power flow corresponding to the EMI in the first frequency range.

27. The apparatus of claim 20 further comprising a display device for displaying the first determined power flow for identifying a frequency corresponding to EMI in the first frequency range.

28. The apparatus of claim 19 wherein the first circuit further comprises a network analyzer having a calibrated output signal at each selected frequency.

29. The apparatus of claim 28 wherein the determining means further comprises a circuit for calculating a reflection coefficient in response to the output signal on the test lead and determining the impedance vector based on the reflection coefficient.

30. The apparatus of claim 28 wherein the second circuit further comprises a minicomputer.

31. The apparatus of claim 30 in which the apparatus is interactive for use by an operator and further comprises:
   a device for displaying instructions to the operator for connecting the test lead to one of the filter source and filter load, for calibrating the test lead, and for controlling the first circuit; and
   a keyboard for the operator to respond to the displayed instruction.

32. The apparatus of claim 19 wherein the second circuit further comprises a third circuit, responsive to the second circuit, for controlling the first circuit for calibrating the impedance vector of the test lead at each of the first plurality of frequencies, so that the test lead impedance vector may be removed from the first and second impedance vectors determined by the first circuit.

33. The apparatus of claim 19 wherein the test lead further comprises a switch having a first state for connecting the test lead and the filter load and a second state for connecting the test lead and the filter source.

34. A method of designing an EMI filter for a device under test having EMI in a first frequency range, the device under test having a selected location for receiving an EMI filter, the selected location having a filter source with a complex impedance and a filter load with a complex impedance, comprising:
   (a) determining a first power flow of the device under test based on the filter source impedances and filter load impedances at each of a first plurality of frequencies;
   (b) identifying a frequency in the first power flow corresponding to EMI in the first frequency range; and
   (c) selecting an EMI filter design based on the filter source and filter load complex impedances at the identified frequency.

35. The method of claim 34 wherein the identified frequency corresponds to a resonant condition in the device.

36. The method of claim 34 wherein the selected EMI filter design has a frequency response and an attenuation for a given frequency, further comprising:
   (d) determining the frequency response of the selected EMI filter design in the selected location for at least the first frequency range; and
   (e) determining whether the selected EMI filter design resolves the EMI in the first frequency range.

37. The method of claim 36 wherein step (e) is based on the attenuation provided by the selected EMI filter design over the first frequency range.

38. The method of claim 34 wherein the selected EMI filter design has a frequency response and an attenuation for a given frequency, further comprising:
   (d) measuring the frequency response of an EMI filter according to the selected EMI filter design; and (e) determining whether the selected EMI filter design resolves the EMI in the first frequency range.

39. The method of claim 34 further comprising selecting one EMI filter design for each identified frequency in the first detected power flow corresponding to EMI and repeating step (c) for each one EMI filter design.

40. The method of claim 39 wherein each EMI filter is a filter having an attenuation frequency range including the identified frequency in the first determined power flow.

41. The method of claim 34 wherein the EMI filter is a filter having an attenuation frequency range including the identified frequency in the first determined power flow.

42. The method of claim 41 wherein the EMI filter is a Butterworth notch frequency filter having a centerpoint corresponding to an identified frequency in the first determined power flow.

43. The method of claim 34 further comprising:
(d) determining a second complex power flow of the device under test with the selected EMI filter design inserted at the selected location, based on the filter source impedance and filter load impedance for the first plurality of frequencies and the selected EMI filter design; and
(e) determining whether the selected EMI filter design reduces the EMI in the first frequency range based on the first and second complex power flows.

44. The method of claim 43 wherein step (e) is based on determining a difference between the first and second complex power flows over the first frequency range.

45. The method of claim 43 wherein the selected EMI filter design has a frequency response for a given frequency, further comprising determining the frequency response of the selected EMI filter design in the selected location for at least the first frequency range, wherein determining the second power flow also is based on the determined frequency response.

46. The method of claims 36, 38 or 43 further comprising adjusting the EMI filter design in response to step (e) determining that EMI is not adequately resolved.

47. The method of claims 34, 35, 37, 38 or 39 further comprising:
constructing an EMI filter according to the selected EMI filter design determined to resolve the EMI in the first frequency range; and
testing the device with the constructed EMI filter inserted at the selected location to verify whether or not the EMI filter design resolves the EMI.

48. Apparatus for use in designing an EMI filter to be inserted at a selected location in a device having EMI in a first frequency range, the location being between a filter source and a filter load comprising:
a first computing means for determining a first power flow of the device based on a first impedance vector array corresponding to the filter load complex impedance at a first plurality of frequencies spanning the first frequency range and a second impedance vector array corresponding to the filter source complex impedance at the first plurality of frequencies; and
means for identifying a frequency in the first determined power flow corresponding to EMI in the first frequency range.

49. The apparatus of claim 48 wherein the identifying means is a display device for visually displaying the first determined power flow.

50. The apparatus of claim 48 further comprising means for determining the complex impedance of the filter load and the filter source at the identified frequency.

51. The apparatus of claim 48 further comprising:
a second computing means for receiving an EMI filter design based upon the complex impedance of the filter load and the filter source at the identified frequency; and
means for determining a frequency response of the received EMI filter design based on the first and second impedance vector arrays.

52. The apparatus of claim 51 further comprising means for determining whether the EMI filter design sufficiently reduces the EMI in the first frequency range based on the frequency response of the EMI filter design.

53. The apparatus of claim 51 further comprising a display device for displaying the first determined power flow for identifying a frequency corresponding to EMI in the first frequency range and for displaying the frequency response of the EMI filter design for determining whether the EMI filter design will resolve the EMI.

54. The apparatus of claim 48 further comprising:
a second computing means for receiving an EMI filter design based upon the complex impedances of the filter load and the filter source at the identified frequency; and
means for determining a second power flow of the device with the EMI filter design inserted at the selected location.

55. The apparatus of claim 54 further comprising means for determining whether the EMI filter design sufficiently reduces the EMI in the first frequency range based on the first and second power flows.

56. The apparatus of claim 54 further comprising a display device for displaying the first determined power flow for identifying a frequency corresponding to EMI in the first frequency range and for displaying the second determined power flow for determining whether the EMI filter design will resolve the EMI.

57. A method for evaluating an EMI filter design for a device under test having EMI in a first frequency range, the device under test having a selected location for receiving an EMI filter providing a filter source having a complex impedance and a filter load having a complex impedance, comprising:
(a) providing a first power flow of the device under test based on the filter source complex impedances and filter load complex impedances at each of a first plurality of frequencies;
(b) receiving an EMI filter design based on the filter source and filter load complex impedances at a frequency in the power flow corresponding to the EMI; and
(c) analytically determining whether the selected EMI filter design resolves the EMI in the first frequency range based on the determined filter load and filter source complex impedances.

58. The method of claim 57 wherein the selected EMI filter design has a frequency response and an attenuation for a given frequency and step (c) further comprises:

(d) determining the frequency response of the selected EMI filter design in the selected location for at least the first frequency range; and (e) determining the attenuation provided by the selected EMI filter design over the first frequency range.

59. The method of claim 58 wherein step (d) further comprising measuring the frequency response of an EMI filter according to the selected EMI filter design.

60. The method of claim 57 further comprising:
evaluating one EMI filter design for each frequency in the first detected power flow corresponding to EMI.

61. The method of claim 60 wherein each EMI filter is a filter having an attenuation frequency range including a frequency in the first determined power flow corresponding to EMI.

62. The method of claim 60 wherein each EMI filter is a Butterworth notch frequency filter having a centerpoint corresponding to a frequency in the first determined power flow corresponding to EMI.

63. The method of claim 57 wherein the EMI filter is a filter having an attenuation frequency range including the frequency in the first determined power flow corresponding to EMI.

64. The method of claim 57 wherein step (c) further comprises:

(d) determining a second complex power flow of the device under test with the selected EMI filter design inserted at the selected location, based on the filter source complex impedances and filter load complex impedances for the first plurality of frequencies and the selected EMI filter design; and wherein step (c) further comprises:

(e) determining whether the selected EMI filter design reduces the EMI in the first frequency range based on the first and second complex power flows.

65. The method of claim 64 wherein step (e) is based on determining a difference between the first and second complex power flows over the first frequency range.

66. The method of claim 64 wherein the selected EMI filter design has a frequency response for a given frequency, further comprising determining the frequency response of the selected EMI filter design in the device for at least the first frequency range, wherein step (c) is based on the first and second powers flows and the determined frequency response.

67. The method of claims 57, 58, 59 or 64 further comprising:
constructing an EMI filter according to the selected EMI filter design determined to resolve the EMI in the first frequency range; and
testing the device with the constructed EMI filter inserted at the selected location to verify whether or not the EMI filter design resolves the EMI.

68. Apparatus for evaluating an EMI filter design to be inserted at a selected location in a device having EMI in a first frequency range, the location being between a filter source and a filter load, comprising:
first means for receiving a first impedance vector array corresponding to the filter load impedance at a first plurality of frequencies spanning the first frequency range and a second impedance vector array corresponding to the filter source impedances at the first plurality of frequencies, said impedance vector arrays being relative to the test point;

second means for receiving an EMI filter design based on the first and second impedance vector arrays; and first means for determining whether the EMI filter design sufficiently reduces the EMI in the first frequency range based on the first and second impedance vector arrays and the EMI filter design.

69. The apparatus of claim 68 further comprising second means for determining determining a frequency response of an EMI filter design based on the first and second impedance vector arrays wherein the first determining means determines whether the EMI filter design sufficiently reduces the EMI in the first frequency range based on the determined frequency response of the EMI filter design.

70. The apparatus of claim 68 further comprising:
second means for determining a first power flow of the device based on the first and second impedance vector arrays; and
third means for determining a second power flow of the device with the EMI filter design at the selected location wherein the first determining means determines whether the EMI filter design sufficiently reduces the EMI in the first frequency range based on the first and second determined power flows.

71. The apparatus of claim 70 wherein the first determining means compares the first and second determined power flows in the first frequency range.

72. The apparatus of claim 71 further comprising a display device for displaying the first and second determined power flows in the first frequency range.

73. The apparatus of claim 70 further comprising a display device for displaying the frequency response of the EMI filter design for determining whether the EMI filter design will resolve the EMI in the first frequency range.

74. A method for use in designing a filter for a device having undesired signal transmission in a first frequency range comprising:

(a) identifying a test point in the device for inserting an a filter, the test point having a filter source having a real and imaginary impedance and a filter load having a real and imaginary impedance;

(b) determining the real and imaginary impedance of the filter source at each of a first plurality of frequencies spanning at least the first frequency range; and (c) determining the real and imaginary impedance of the filter load at each of the first plurality of frequencies and characterizing the undesired signal transmission based on the determined real and imaginary impedances of the filter source and filter load to be used in a filter designing process.

75. The method of claim 74 further comprising:
(d) determining a first power flow of the device under test based on the determined filter source impedances and filter load impedances for the first plurality of frequencies.

76. The method of claim 75 further comprising:
(e) identifying a frequency in the first power flow corresponding to undesired signal transmission in the first frequency range; and
(f) selecting a filter design based on the determined filter source and filter load impedances at the identified frequency.

77. The method of claim 76 wherein the identified frequency corresponds to a resonant condition in the device.

78. The method of claim 76 wherein the selected filter design has a frequency response and an attenuation for a given frequency further comprising:
   (g) determining the frequency response of the selected filter design in the device for at least the first frequency range; and
   (h) determining whether the selected filter design resolves the undesired signal transmission in the first frequency range.

79. The method of claim 78 wherein step (h) is based on determining the attenuation provided by the selected filter design over the first frequency range.

80. The method of claim 76 wherein the selected filter design has a frequency response and an attenuation for a given frequency, further comprising
   (g) measuring the frequency response of a filter according to the selected filter design; and
   (h) determining whether the selected filter design resolves the undesired signal transmission in the first frequency range.

81. The method of claim 76 further comprising selecting one filter design for each identified frequency in the first detected power flow corresponding to undesired signal transmission in a distinct frequency range and repeating step (f) for each one filter design.

82. The method of claim 81 wherein each filter is a filter having an attenuation frequency including an identified frequency in the first determined power flow.

83. The method of claim 76 wherein the filter is a filter having an attenuation frequency range including the identified frequency in the first determined power flow.

84. The method of claim 76 further comprising:
   (g) determining a second complex power flow of the device under test with the selected filter design inserted at the test point, based on the determined filter source impedance and filter load impedance for the first plurality of frequencies and the selected filter design; and
   (h) determining whether the selected filter design reduces the undesired signal transmission in the first frequency range based on the first and second complex power flows.

85. The method of claim 84 wherein step (h) is based on determining a difference between the first and second complex power flows over the first frequency range.

86. The method of claim 84 wherein the selected filter design has a frequency response for a given frequency, further comprising determining the frequency response of the selected filter design in the device for at least the first frequency range, wherein determining the second power flow also is based on the determined frequency response.

87. The method of claims 78, 80 or 84 further comprising adjusting the filter design in response to step (h) determining that the undesired signal transmission is not adequately resolved.

88. The method of claims 76, 78, 80, 81 or 82 further comprising:
   constructing a filter according to the selected filter design determined to resolve the undesired signal transmission in the first frequency range; and
   testing the device with the constructed filter inserted at the test point to verify whether or not the selected filter design resolves the undesired signal transmission.

89. The method of claim 74 wherein each of the steps of determining the filter source impedance and determining the filter load impedance further comprises measuring a reflected signal in response to a known signal at a selected frequency, determining a reflection coefficient, and converting the reflection coefficient to the real and imaginary impedances.

90. The method of claim 74 wherein each of the steps of determining the filter source impedance and determining the filter load impedance further comprises:
   (i) selecting one frequency in the first plurality of frequencies;
   (ii) transmitting a first signal at the one frequency to the impedance being determined and measuring a second signal reflected from the impedance being determined;
   (iii) determining the reflection coefficient at the one frequency;
   (iv) determining the real and imaginary impedance at the one frequency based on the determined reflection coefficient; and
   (v) repeating steps, (i), (ii), (iii), and (iv) for each of a second plurality of frequencies within the first plurality of frequencies.

91. Apparatus for characterizing the impedance at a selected location in a device having undesired signal transmission in a first frequency range, the location being between a filter source and a filter load comprising:
   a test lead for connecting the apparatus to one of the filter source and the filter load at the selected location;
   a first circuit having an output for providing a signal on the test lead, the signal having a frequency selected from among a selected range of frequencies, the selected range of frequencies including the first frequency range;
   a second circuit for controlling the first circuit to provide an output signal at each of a first plurality of frequencies in the selected frequency range, one frequency at a time;
   means for determining an impedance vector across the output of the first circuit in response to each provided output signal; and
   means for controlling the first and second circuits to obtain a first impedance vector array for the filter load and a second impedance vector array for the filter source.

92. The apparatus of claim 91 further comprising means for determining a first power flow of the device based on the first and second impedance vector arrays.

93. The apparatus of claim 92 wherein the filter design has a frequency response for a given frequency, further comprising means for receiving a filter design and means for determining the frequency response of the filter design based on the first and second impedance vector arrays.

94. The apparatus of claim 93 further comprising means for determining whether the filter design sufficiently reduces the undesired signal transmission in the first frequency range based on the frequency response of the filter design.

95. The apparatus of claim 93 further comprising a display device for displaying the first determined power flow for identifying a frequency corresponding to undesired signal transmission in the first frequency range and for displaying the frequency response of the filter design for determining whether the filter design will resolve the undesired signal transmission.

96. The apparatus of claim 92 further comprising means for receiving an filter design and means for determining a second power flow of the device with the filter design inserted at the selected location.

97. The apparatus of claim 96 further comprising means for determining whether the filter design sufficiently reduces the undesired signal transmission in the first frequency range based on the first and second power flows.

98. The apparatus of claim 92 further comprising means for indicating a the frequency in the first determined power flow corresponding to the undesired signal transmission in the first frequency range.

99. The apparatus of claim 92 further comprising a display device for displaying the first determined power flow for identifying a frequency corresponding to undesired signal transmission in the first frequency range.

100. The apparatus of claim 91 wherein the first circuit further comprises a network analyzer having a calibrated output signal at each selected frequency.

101. The apparatus of claim 100 wherein the determining means further comprises a circuit for calculating a reflection coefficient in response to the output signal on the test lead and determining the impedance vector based on the reflection coefficient.

102. The apparatus of claim 100 wherein the second circuit further comprises a minicomputer.

103. The apparatus of claim 102 in which the apparatus is interactive for use by an operator and further comprises:
  a device for displaying instructions to the operator for connecting the test lead to one of the filter source and filter load, for calibrating the test lead, and for controlling the first circuit; and
  a keyboard for the operator to respond to the displayed instruction.

104. The apparatus of claim 91 wherein the second circuit further comprises a third circuit, responsive to the second circuit, for controlling the first circuit for calibrating the impedance vector of the test lead at each of the first plurality of frequencies, so that the test lead impedance vector may be removed from the first and second impedance vectors determined by the first circuit.

105. The apparatus of claim 91 wherein the test lead further comprises a switch having a first state for connecting the test lead and the filter load and a second state for connecting the test lead and the filter source.

106. A method of designing a filter for a device having undesired signal transmission in a first frequency range, the device having a selected location for receiving a filter and having a filter source with a complex impedance and a filter load with a complex impedance, comprising:
  (a) determining a first power flow of the device based on the filter complex source impedances and filter complex load impedances at each of a first plurality of frequencies;
  (b) identifying a frequency in the first power flow corresponding to the undesired signal transmission in the first frequency range; and
  (c) selecting a filter design based on the filter source and filter load complex impedances at the identified frequency.

107. The method of claim 106 wherein the identified frequency corresponds to a resonant condition in the device.

108. The method of claim 106 wherein the selected filter design has a frequency response and an attenuation for a given frequency, further comprising:
  (d) determining the frequency response of the selected filter design in the selected location for at least the first frequency range; and
  (e) determining whether the selected filter design resolves the undesired signal transmission in the first frequency range.

109. The method of claim 108 wherein step (e) is based on the attenuation provided by the selected filter design over the first frequency range.

110. The method of claim 106 wherein the selected filter design has a frequency response and an attenuation for a given response, further comprising:
  (d) measuring the frequency response of a filter according to the selected filter design; and
  (e) determining whether the selected filter design resolves the undesired signal transmission in the first frequency range.

111. The method of claim 106 further comprising selecting one filter design for each identified frequency in the first detected power flow corresponding to undesired signal transmission and repeating step (c) for each one selected filter design.

112. The method of claim 111 wherein each selected filter is a filter having an attenuation range including an identified frequency in the first determined power flow.

113. The method of claim 106 wherein the filter is a filter having an attenuation frequency range including the identified frequency in the first determined power flow.

114. The method of claim 106 further comprising:
  (d) determining a second complex power flow of the device with the selected filter design inserted at the selected location, based on the filter source impedance and filter load impedance for the first plurality of frequencies and the selected filter design; and
  (e) determining whether the selected filter design reduces the selected undesired signal transmission in the first frequency range based on the first and second complex power flows.

115. The method of claim 114 wherein step (e) is based on determining a difference between the first and second complex power flows over the first frequency range.

116. The method of claim 114 wherein the selected filter design has a frequency response for a given frequency, further comprising determining the frequency response of the selected filter design in the selected location for at least the first frequency range, wherein determining the second power flow also is based on the determined frequency response.

117. The method of claims 108, 110 or 115 further comprising adjusting the filter design in response to step (e) determining that the selected undesired signal transmission is not adequately resolved.

118. The method of claims 106, 107, 109, 110 or 111 further comprising:
  constructing a filter according to the selected filter design determined to resolve the undesired signal transmission in the first frequency range; and
  testing the device with the constructed filter inserted at the selected location to verify whether or not the EMI filter design resolves the undesired signal transmissions.

119. Apparatus for use in designing a filter to be inserted at a selected location in a device having selected undesired signal transmission in a first frequency range, the location being between a filter source and a filter load comprising:
- a first computing means for determining a first power flow of the device based on a first impedance vector array corresponding to the filter load complex impedance at a first plurality of frequencies spanning the first frequency range and a second impedance vector array corresponding to the filter source complex impedance at the first plurality of frequencies; and
- means for identifying a frequency in the first determined power flow corresponding to the selected undesired signal transmission in the first frequency range.

120. The apparatus of claim 119 wherein the identifying means is a display device for visually displaying the first determined power flow.

121. The apparatus of claim 119 further comprising means for determining the complex impedance of the filter load and the filter source at the identified frequency.

122. The apparatus of claim 121 further comprising:
- a second computing means for receiving a filter design based upon the complex impedance of the filter load and the filter source at the identified frequency; and
- means for determining a frequency response of the received filter design based on the first and second impedance vector arrays.

123. The apparatus of claim 122 further comprising means for determining whether the filter design sufficiently reduces the undesired signal transmission in the first frequency range based on the frequency response of the filter design.

124. The apparatus of claim 122 further comprising a display device for displaying the first determined power flow for identifying a frequency corresponding to the undesired signal transmission in the first frequency range and for displaying the frequency response of the filter design for determining whether the filter design will resolve the undesired signal transmission.

125. The apparatus of claim 119 further comprising:
- a second computing means for receiving a filter design based upon the complex impedances of the filter load and the filter source at the identified frequency; and
- means for determining a second power flow of the device with the filter design inserted at the selected location.

126. The apparatus of claim 125 further comprising means for determining whether the filter design sufficiently reduces the undesired signal transmission in the first frequency range based on the first and second power flows.

127. The apparatus of claim 125 further comprising a display device for displaying the first determined power flow for identifying a frequency corresponding to the undesired signal transmission in the first frequency range and for displaying the second determined power flow for determining whether the filter design will resolve the undesired signal transmission.

128. A method for evaluating a filter design for a device having undesired signal transmission in a first frequency range, the device having a selected location for receiving a filter and having a filter source having a complex impedance and a filter load having a complex impedance, comprising:
- (a) providing a first power flow of the device based on the filter source complex impedances and filter load complex impedances at each of a first plurality of frequencies;
- (b) receiving a filter design based on the filter source and filter load complex impedances at a frequency in the power flow corresponding to the undesired signal transmission; and
- (c) analytically determining whether the selected filter design resolves the undesired signal transmission in the first frequency range based on the determined filter load and filter source complex impedances.

129. The method of claim 128 wherein the selected filter design has a frequency response and an attenuation for a given frequency, and step (c) further comprises:
- (d) determining the frequency response of the selected filter design in the selected location for at least the first frequency range; and
- (e) determining the attenuation provided by the selected filter design over the first frequency range.

130. The method of claim 129 wherein step (d) further comprising measuring the frequency response of a filter according to the selected filter design.

131. The method of claim 128 further comprising:
evaluating one filter design for each frequency in the first detected power flow corresponding to an undesired signal transmission over a distinct frequency range.

132. The method of claim 131 wherein each filter is a filter having an attenuation range including a frequency in the first determined power flow corresponding to undesired signal transmission.

133. The method of claim 128 wherein the filter is a filter having an attenuation frequency range including the frequency in the first determined power flow corresponding to undesired signal transmission.

134. The method of claim 128 wherein step (c) further comprises:
- (d) determining a second complex power flow of the device with the selected filter design inserted at the selected location, based on the filter source complex impedances and filter load complex impedances for the first plurality of frequencies and the selected filter design; and wherein step (c) further comprises:
- (e) determining whether the selected filter design reduces the undesired signal transmission in the first frequency range based on the first and second complex power flows.

135. The method of claim 134 wherein step (e) is based on determining a difference between the first and second complex power flows over the first frequency range.

136. The method of claim 134, wherein the selected filter design has a frequency response for a given frequency, further comprising determining the frequency response of the selected filter design in the device for at least the first frequency range, wherein step (c) is based on the first and second powers flows and the determined frequency response.

137. The method of claims 128, 129, 130 or 134 further comprising:

constructing a filter according to the selected filter design determined to resolve the undesired signal transmission in the first frequency range; and testing the device with the constructed filter inserted at the selected location to verify whether or not the filter design resolves the undesired signal transmissions.

138. Apparatus for evaluating a filter design to be inserted at a selected location in a device having undesired signal transmission in a first frequency range, the location being between a filter source and a filter load, comprising:

first means for receiving a first impedance vector array corresponding to the filter load impedance at a first plurality of frequencies spanning the first frequency range and a second impedance vector array corresponding to the filter source impedances at the first plurality of frequencies, said impedance vector arrays being relative to the test point;

second means for receiving a filter design; and first means for determining whether the filter design sufficiently reduces the undesired signal transmission in the first frequency range based on the first and second impedance vector arrays and the received filter design.

139. The apparatus of claim 138 further comprising second means for determining a frequency response of a filter design based on the first and second impedance vector arrays wherein the first determining means determines whether the filter design sufficiently reduces the undesired signal transmission in the first frequency range based on the determined frequency response of the filter design.

140. The apparatus of claim 138 further comprising:

second means for determining a first power flow of the device based on the first and second impedance vector arrays; and third means for determining a second power flow of the device with the filter design at the selected location wherein the first determining means determines whether the filter design sufficiently reduces the undesired signal transmission in the first frequency range based on the first and second determined power flows.

141. The apparatus of claim 140 wherein the first determining means compares the first and second determined power flows in the first frequency range.

142. The apparatus of claim 141 further comprising a display device for displaying the first and second determined power flows in the first frequency range.

143. The apparatus of claim 140 further comprising a display device for displaying the frequency response of the filter design for determining whether the filter design will resolve the undesired signal transmission in the first frequency range.

* * * * *